Figure 5:
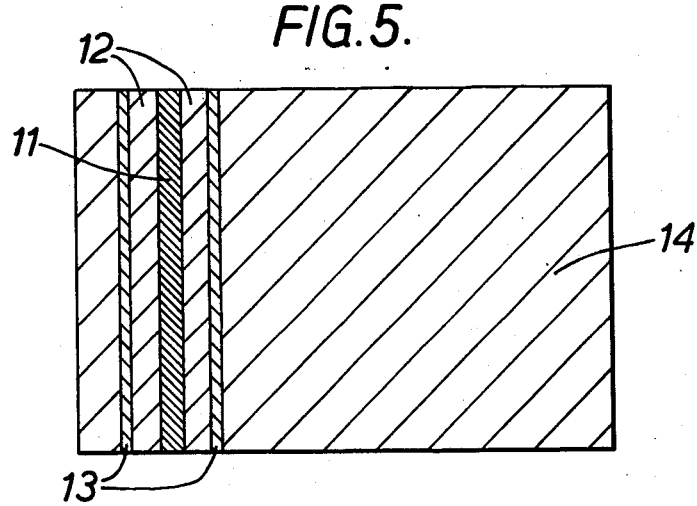

United States Patent [19]

Madsen et al.

[11] 4,094,060

[45] June 13, 1978

[54] SUPERCONDUCTING MEMBERS AND METHODS OF MANUFACTURE THEREOF

[75] Inventors: Peter Emil Madsen, Didcot; John Philip Charlesworth, Witney; Derek Armstrong, Wallingford, all of England

[73] Assignee: United Kingdom Atomic Energy Authority, England

[21] Appl. No.: 584,905

[22] Filed: Jun. 9, 1975

Related U.S. Application Data

[63] Continuation of Ser. No. 383,476, Jul. 30, 1973, abandoned.

[30] Foreign Application Priority Data

Aug. 4, 1972 United Kingdom ............... 36637/72

[51] Int. Cl.$^2$ ....................... H01V 11/14; H01V 11/00
[52] U.S. Cl. ................................. 29/599; 148/11.5 R; 174/126 CP
[58] Field of Search .......................................... 29/599

[56] References Cited

U.S. PATENT DOCUMENTS

| 3,625,662 | 12/1971 | Roberts et al. | 29/599 |
|---|---|---|---|
| 3,652,967 | 3/1972 | Tanaka et al. | 29/599 |
| 3,665,595 | 5/1972 | Tanaka et al. | 29/599 |
| 3,728,165 | 4/1973 | Howlett | 29/599 |
| 3,813,764 | 6/1974 | Tanaka et al. | 29/599 |
| 3,868,768 | 3/1975 | Meyer | 29/599 |
| 3,874,074 | 4/1975 | Meyer | 29/599 |
| 3,876,473 | 4/1975 | McDougall | 29/599 |
| 3,958,327 | 5/1976 | Marancik et al. | 29/599 |
| 3,996,661 | 12/1976 | Ziegler et al. | 29/599 |

FOREIGN PATENT DOCUMENTS

| 2,195,090 | 1/1974 | France | 29/599 |
|---|---|---|---|
| 1,394,724 | 5/1975 | United Kingdom | 29/599 |

Primary Examiner—C.W. Lanham
Assistant Examiner—V. K. Rising
Attorney, Agent, or Firm—Larson, Taylor and Hinds

[57] ABSTRACT

A superconducting member is manufactured by mechanical fabrication to final dimensions of a matrix comprising a base material, such as niobium, an alloy essentially consisting of a carrier material and at least one element, such as tin, a metal for stabilization and a barrier material protecting the metal for stabilization. After mechanical fabrication a superconducting compound of the base material and the element is formed by heat treatment to cause a solid state reaction. The barrier material prevents diffusion of any of the components into the metal for stabilization.

5 Claims, 12 Drawing Figures

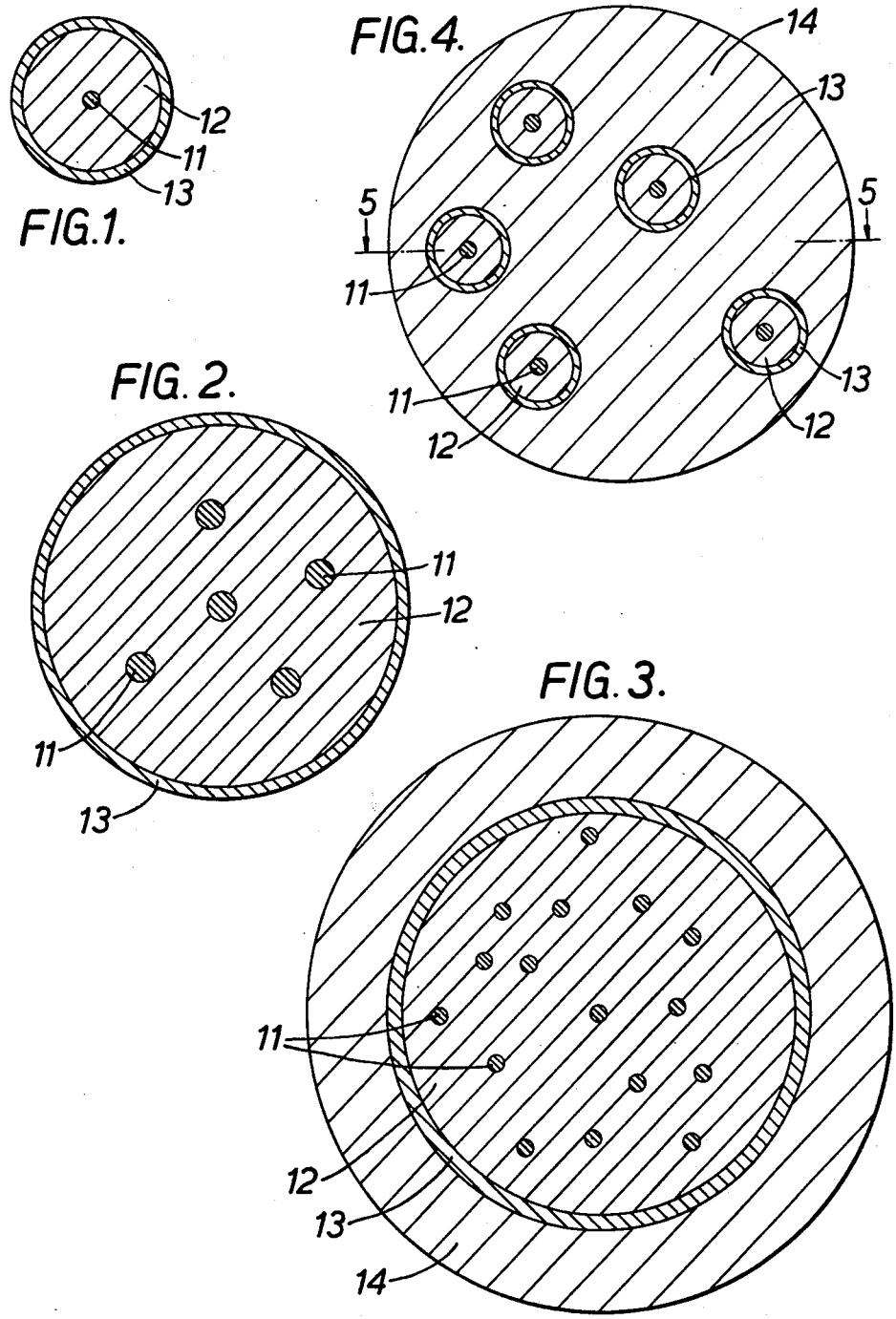

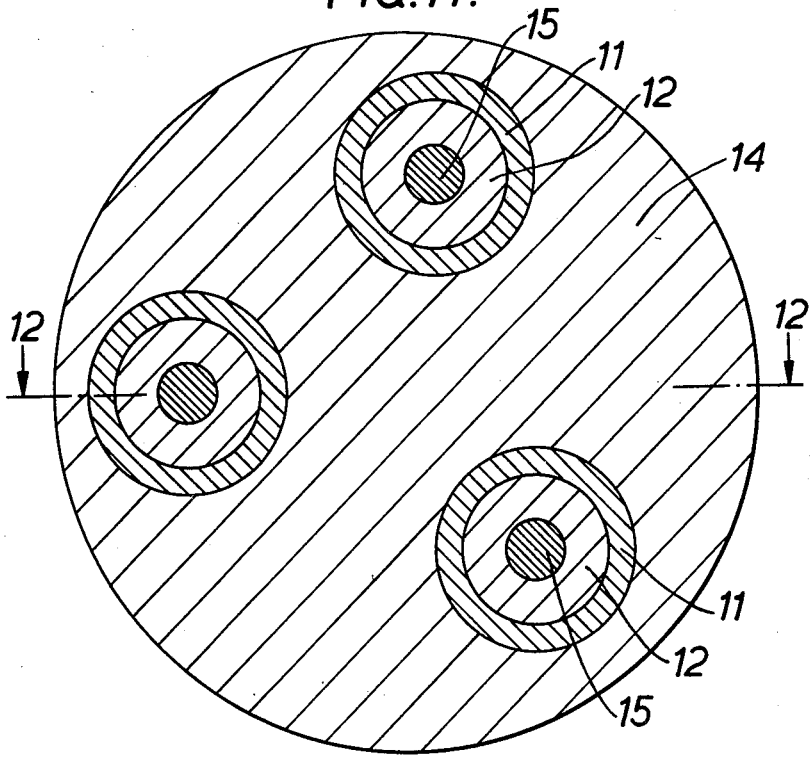
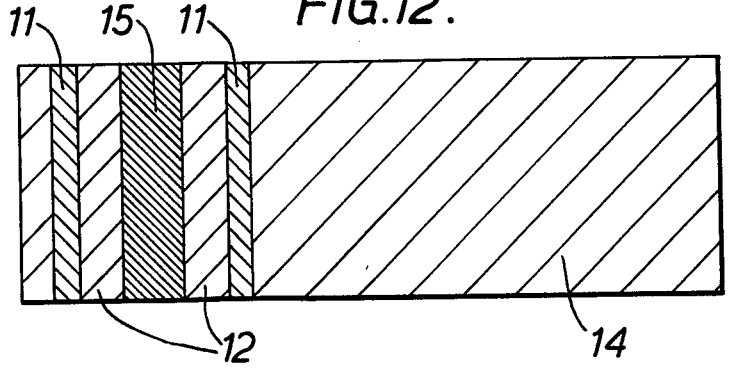

SUPERCONDUCTING MEMBERS AND METHODS OF MANUFACTURE THEREOF

This is a continuation, of application Ser. No. 383,476 filed July 30, 1973 now abandoned.

BACKGROUND OF THE INVENTION

The invention relates to superconducting members and methods of manufacture thereof.

By superconducting member is meant a member which will exhibit superconductivity when its temperature is lowered below its critical temperature. Materials of particular interest in this field are those which have comparatively high critical temperatures and comparatively high critical magnetic fields. Such materials are compounds of A15 crystal structure having the general formula $A_3B$ where A comprises niobium or vanadium and B comprises one or more of the elements aluminium, gallium, indium, silicon, germanium and tin.

Patent Specification No. 52623/69 described a method of manufacturing such a superconducting member which permits formation of the desired final size and shape of superconducting member by a simple mechanical forming operation applied simultaneously to all the components which go into the manufacture. In particular, the invention of Patent Specification No. 52623/69 provides a method of manufacturing a superconducting member wherein there is formed an alloy essentially consisting of a carrier material and at least one element from the group consisting of aluminium, gallium, indium, silicon, germanium and tin, and the alloy is contacted with a base material essentially consisting of niobium or vanadium and heat treated to cause a solid state reaction between the niobium or vanadium and the element or elements from the said group to form a superconducting compound therewith, the carrier material being such as will not react substantially with the base material under the heat treatment and the heat treatment temperature being controlled for avoiding melting of the alloy at any stage during the reaction.

The present invention is concerned with the stabilisation of superconducting members manufactured by this method.

By stabilisation is meant the prevention or amelioration of the undesirable effects of sudden movement of magnetic flux, known as 'flux jumps', within the superconducting member. The invention relates to the combination in the same superconducting member of two methods of stabilisation known respectively as 'filamentary stabilisation' in which the superconducting material is present in the form of many fine filaments in a normally-conducting matrix, and 'dynamic stabilisation' in which a proportion of the normally-conducting matrix is in the form of a material of high electrical conductivity such as pure copper.

The method described in Patent Specification No. 52623/69, and referred to above, is particularly suitable for producing many fine filaments of superconductors in a matrix of normal material. However, the normal material thus formed is an alloy and not a pure metal. In general it is not practicable to so adjust the starting compositions and the reaction conditions that the alloy matrix will have the required level of electrical conductivity for dynamic stabilisation (resistivity about $10^{-8}$ ohm cm).

With ductile filamentary superconductors, e.g. niobium titanium alloys, it is possible to fabricate the superconductors embedded in a pure copper matrix since no significant interdiffusion occurs at the heat treatment temperatures necessary to get optimum critical currents (300°–400° C). However, with A15 superconductors produced by the abovedescribed method, the B element from the composite material will diffuse rapidly into the copper. This has the disadvantages of slowing the formation of $A_3B$ and of producing Kirkendall porosity in the composite material, but its most deleterious effect is to raise the resistance of the copper to an unacceptably high value for D.C. stabilisation.

One method of avoiding this diffusion problem would be to apply the pure metal (e.g. copper) to the composite material after the $A_3B$ reaction by some process which can occur at room or low temperatures, e.g. by electrodeposition. However, electrodeposits are known to have high resistivities which are not removed on low temperature annealing. There are also many potential applications of multifilament superconductors where the wires are required to be bent more sharply than is possible with reacted material. In these cases it would be possible to react the composite after the coil has been wound if the copper, or other pure metal, can be protected from diffusion of impurities.

SUMMARY OF THE INVENTION

The present invention provides a method of manufacturing a superconducting member wherein there is formed a composite material essentially consisting of a carrier material (as herein defined) and at least one element which when contacted with a base material and heat treated will react with the base material to form a superconducting compound; the composite material and the base material together with a metal, which is eventually to provide stabilisation, are formed into a unitary structure, a barrier material (as herein defined) being present and positioned to protect the said metal from diffusion thereinto of any of the other components; and the said unitary structure is heat treated to cause a solid state reaction between the base material and the element or elements to form a superconducting compound therewith, the heat treatment temperature being controlled for avoiding melting of the composite material in contact with the base material at any stage during the reaction.

According to a further aspect of the present invention there is provided a method of manufacturing a superconducting member wherein: a superconductor of A15 crystal structure having the general formula $A_3B$, (where A is a substrate metal and B is one or more elements which when alloyed with the substrate metal A will form the said superconductor), is formed by contacting the metal A with a carrier material containing one or more of the elements B and heat treating the metal A and the carrier material to cause a solid state reaction between the element or elements B and the metal A to form a superconducting compound therewith; a stabilising metal is provided for stabilising the superconductor when in use; and a barrier material (as herein defined) is disposed between, and in contact with, the stabilising metal and the carrier material to protect the stabilising metal from diffusion thereinto of any of the other components during the said heat treatment.

According to a further aspect of the present invention there is provided a method of manufacturing a superconducting member wherein there is formed a composite material essentially consisting of a carrier material (as herein defined) and at least one element from the group consisting of aluminium, gallium, indium, silicon, germanium, gold, platinum, antimony, rhodium, zirconium, palladium, osmium, ruthenium, cobalt, thallium, lead, arsenic, bismuth, iridium and tin; the composite material is contacted with a base material essentially consisting of niobium; the composite material and the base material together with a metal, which is eventually to provide stabilisation, are formed into a unitary structure, a barrier material (as herein defined) being present and positioned to protect the said metal from diffusion thereinto of any of the other components; and the said unitary structure is heat treated to cause a solid state reaction between the niobium and the element or elements from the said group to form a superconducting compound therewith, the heat treatment temperature being controlled for avoiding melting of the composite material in contact with the niobium at any stage during the reaction.

According to a further aspect of the present invention there is provided a method of manufacturing a superconducting member wherein there is formed a composite material essentially consisting of a carrier material (as herein defined) and at least one element from the group comprising aluminium, gallium, indium, silicon, germanium, antimony, arsenic, beryllium and tin; the composite material is contacted with a base material essentially consisting of vanadium; the composite material and the base material together with a metal, which is eventually to provide stabilisation, are formed into a unitary structure, a barrier material (as herein defined) being present and positioned to protect the said metal from diffusion thereinto of any of the other components; and the said unitary structure is heat treated to cause a solid state reaction between the vanadium and the element or elements from the said group to form a superconducting compound therewith, the heat treatment temperature being controlled for avoiding melting of the composite material in contact with the vanadium at any stage during the reaction.

The carrier material will in general essentially consist of an element from the group comprising copper, silver and gold, but requires selection to meet the following functional requirements, which define the carrier material:

(1) it should not react substantially with the base material under the heat treatment;
(2) considered together with the chosen element or elements of the aforesaid group and the concentration of the element or elements in the carrier material, there should be no unwanted compound which is formed under the range of temperature and element concentrations occurring during the reaction treatment.

By "unwanted compound" is meant any compound which interferes significantly with the formation of the superconducting material or the superconducting properties of the product matrix.

It is to be understood that references to the composite material essentially consisting of a carrier material and at least one element from the said group are intended to include the use of carrier materials and/or the element or elements (which ultimately are reacted in the solid state with the base material to form a superconducting compound) with, or without, one or more other alloying elements in minor quantities, or acceptable impurities, or additives, or diluents being present therein. Such other alloying elements, impurities, additives or diluents essentially must not unacceptably affect the reaction between the base material and the said element which ultimately reacts with the base material to form the superconducting compound, and must not produce unacceptable deleterious effects on the superconducting properties of the superconducting compound formed.

Similarly, references to the base material include the use of such materials, with or without acceptable impurities or additives or diluents which do not unacceptably affect the reaction between the base material and the element which ultimately reacts with the base material to form the superconducting compound.

Preferably the composite material comprises a solid solution of the element or elements of the said group in the carrier material.

Two or more of the elements which are ultimately reacted with the base material to form a superconducting compound may exist together in solid solution in the carrier material. For example, Pt and Au may be present in the carrier material so that when reacted with niobium (base material) it forms the compound $Nb_3(Pt_{0.3}Au_{0.7})$. Similarly, the following superconducting compounds could be formed with niobium as the base material by providing the appropriate elements in the carrier material of the composite material, namely, $Nb_3(Al_{0.8}Ge_{0.2})$ and $Nb_3(Al_{0.9}Sb_{0.1})$.

As mentioned in Patent Specification No. 52623/69 it is envisaged that additives may be desirable in certain circumstances. For example, up to 25 percent by weight of tantalum may be included in niobium and improve significantly the mechanical properties of the niobium without seriously affecting the superconducting properties of the compound formed by the aforesaid method.

The barrier material is defined in general terms as any material substantially meeting the following requirements:

(1) The barrier material should be impermeable to to B element. It should also be impermeable to any other additions to the composite material, and also to the carrier material if this is different from the pure element used for stabilisation. The B element, and the other elements involved, should preferably be insoluble in the barrier material. However, the requirement is satisfied if the elements show negligible solubility during the fabrication heat treatments, i.e. if it is impermeable during any hot working, intermediate anneals to recrystallise the composite material, during the reaction anneal to convert A to $A_3B$, during any subsequent annealing (e.g. to heal cracking in the $A_3B$ layer), or in any other fabrication process.
(2) The barrier material should be insoluble in the metal (which, in general, will be pure metal) used for stabilisation, for if any appreciable amount dissolved during the fabrication treatments it would raise the resistivity of the pure metal.
(3) The barrier material should have similar mechanical properties to the composite material and the pure metal used for stabilisation so that the multifilament composite can be fabricated. Problems in fabrication arise when one component is very much harder or softer than the others. A very hard component will hardly be deformed and may prevent any A filaments enclosed by it being deformed. A very soft component may neck down leading to a tensile fracture. Some of these problems can be minimised by careful design of the composite. The main necessity is of course to avoid any break in the barrier layer during fabrication.

Several refractory metals, e.g. W or Mo, which would otherwise be eminently suitable as barrier materials, are brittle at room temperature. Very pure molybdenum can be fabricated and it is possible that this could be employed as a barrier material if it becomes available on a suitable commercial scale.

(4) The barrier material should not form extensive compound layers with the pure metal or with components of the composite material. Ideally one would want no compounds at either interface of the barrier layer as they are likely to be brittle and cracks in these compounds will hinder the flow of heat through the barrier. In practice a barrier material satisfying this and all the other requirements for the barrier layer is unlikely to be found. If however the compound layer is thin then, for example, on a cylindrical shaped barrier the cracks are likely to be radial and the heat flow should not be greatly impeded. With thicker layers this radial pattern will be less pronounced and the flow of heat more affected. Thus the reaction rates of the barrier must be much slower than that of A to form $A_3B$. Another reason for requiring this is that if the reaction rate were faster the composite material might be depleted in B before much $A_3B$ had formed.

(5) With the exception of one possible configuration, discussed below, any compound formed at the barrier interface should not be a high field superconductor, for the filament, or filaments, of $A_3B$ would then be completely surrounded by a hollow cylinder of a high field superconductor. Until the critical field of this compound is exceeded the enclosed filaments will be shielded by this cylinder and the effective diameter of the filaments will be that of the cylinder. For equipment constructed from such a composite superconductor, and operating above the critical field of the barrier layer compound (when the enclosed filaments should behave independently), there may be instabilities when running the field up below this critical value.

In a preferred method according to the invention the barrier material comprises tantalum.

In an alternative method according to the invention, the barrier material comprises the same material as the base material, namely niobium or vanadium as the case may be. In one example of matrix configuration, one or more filaments of niobium or vanadium are embedded in cylinders of composite material, which is encompassed by the barrier material which, in turn, is embedded or otherwise in contact with the metal used for stabilisation. As discussed above, with such a configuration after forming and reaction, the superconducting filaments will be encompassd by a hollow cylindrical high field superconductor, formed by reaction of the B metal in the composite material with the niobium or vanadium barrier layer. This may be acceptable but an improved configuration may be achieved by replacing filaments of niobium or vanadium with fine tubes of niobium or vanadium embedded in the metal used for stabilisation and having a core of composite material within each tube.

The invention includes a superconductor material when made by any of the aforesaid methods.

Figure 9:
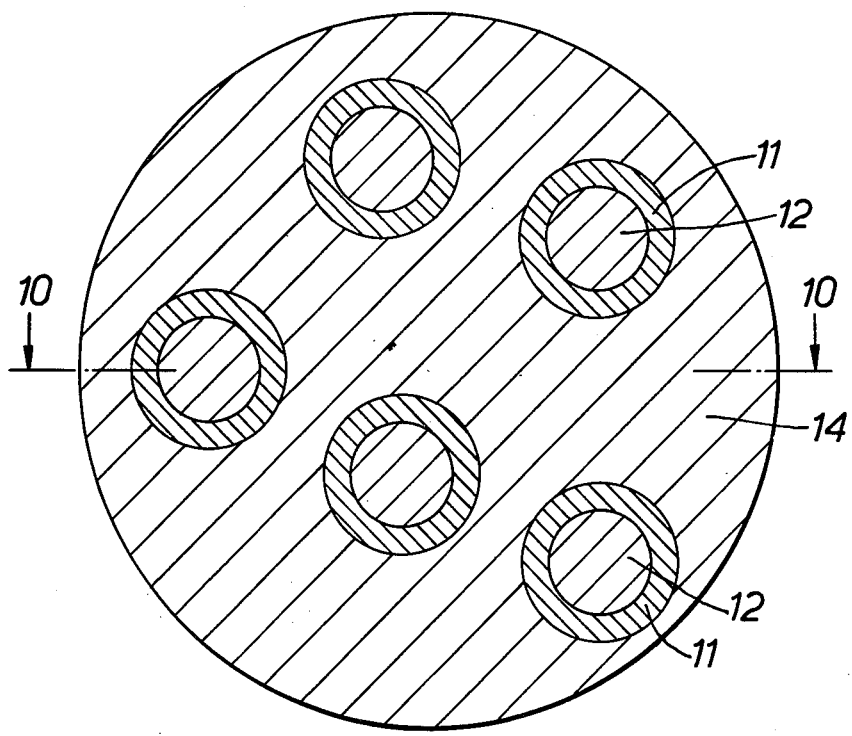
Figure 10:
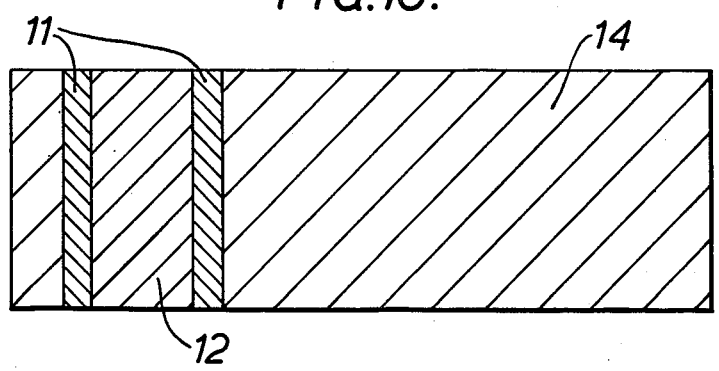

Specific methods of manufacture and constructions of superconducting material embodying the invention will now be described by way of example and with reference to the accompanying drawings in which:

FIGS. 1 to 4 and 6 to 8 are diagrammatic transverse sectional views of various matrix configurations, FIG. 5 being a section on the line 5 — 5 of FIG. 4, and FIGS. 9 and 11 are diagrammatic transverse sectional views of further matrix configurations, where the barrier layer is comprised by the A metal itself, FIGS. 10 and 12 being sections on the lines 10 — 10 and 12 — 12 of FIGS. 9 and 11 respectively.

In one example described in British Patent Specification No. 52623/69, a billet of copper-tin bronze is drilled with a plurality of holes into which are inserted rods of niobium. The billet is then drawn or extruded to form an extended wire comprising a copper-tin matrix carrying a plurality of niobium filaments. The wire is heat treated under controlled conditions, in particular, such that the bronze in contact with the niobium does not melt, but such that solid state reaction takes place between the tin and the niobium to form $Nb_3Sn$ filaments within the tin-depleted bronze matrix.

This general form of manufacturing procedure is followed in the examples of the present invention, except that pure metal for stabilisation is mechanically processed together with the composite material and the base material (niobium or vanadium), and a barrier material is incorporated to protect the pure metal from diffusion thereinto of any of the other components.

A wide range of possible starting configurations may be employed and some of these are illustrated in the accompanying drawings. These configurations selected for illustration are not necessarily the best for producing optimum superconducting properties, but merely illustrate, schematically, various possible arrangements of the barrier materials between the composite material and the pure metal used for stabilisation. The optimum configuration has to be selected according to the elements employed and the particular superconducting application for which the superconducting member is manufactured. In general, an ideal configuration would result in pure metal for stabilisation being in intimate contact with the superconducting compound throughout the length of the member. This is difficult to realise in practice, but can be approached using the configuration of FIG. 9 as such or as modified with the pure metal inside the tubes of metal A and the bronze outside the tubes.

In the drawings, the metal A (niobium or vanadium) is referenced 11. The composite material (bronze) is referenced 12. The barrier material is referenced 13 and the pure metal for stabilisation is referenced 14. In FIGS. 1 and 2, hollow cylinders of barrier material 13 containing bronze 12 and rods of metal A referenced 11 are envisaged embedded in a block of pure metal which is not shown in these Figures.

The barrier material 13 may surround a single filament 11 (FIG. 1), a group of filaments (FIG. 2) or all the filaments in the composite (FIG. 3). In these diagrams the barriers have been shown as cylindrical tubes of circular cross-section. When the deformation is symmetrical this will obviously be the best geometry, the most economical of barrier material and probably the easiest to manufacture. However, the essential feature of the barrier is that it should completely separate the bronze 12 from the pure metal 14 over the whole length of the wire. These composites may be manufactured by various methods. For instance, when starting with a large block of the pure metal, e.g. copper, sufficient holes may be drilled to provide all the filaments when the material is deformed. These holes may be filled with a tube of the barrier material, then a bronze tube and finally the rod A (FIG. 4). Alternatively the holes may be filled with tubes of the barrier metal and previously manufactured bronze cores containing several A filaments (with or without barrier layers).

Figure 6:
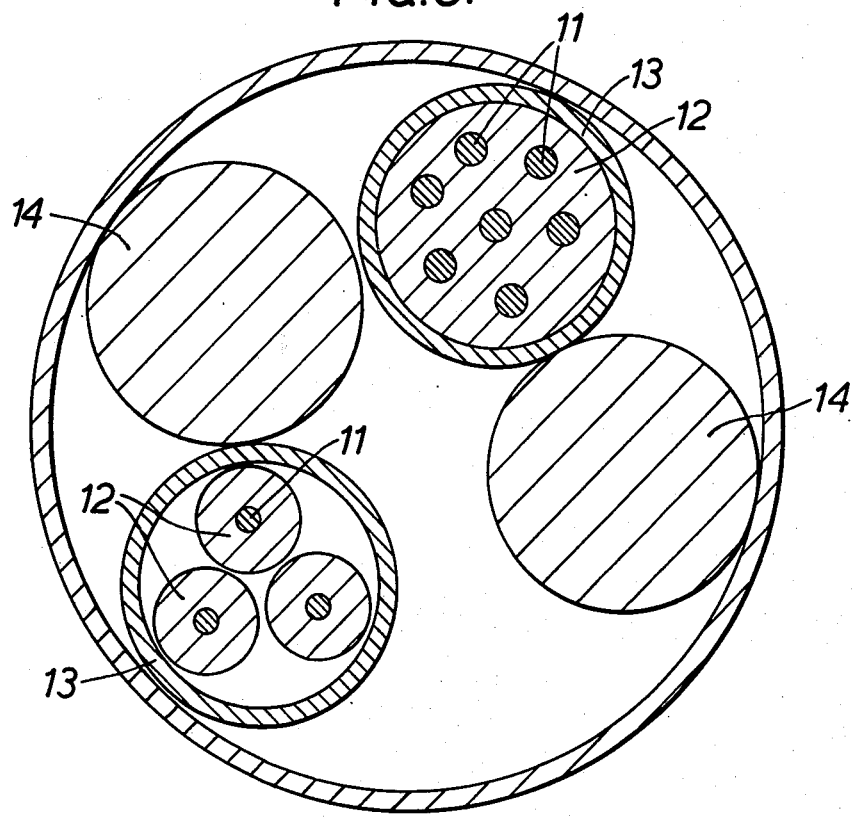
Figure 7:
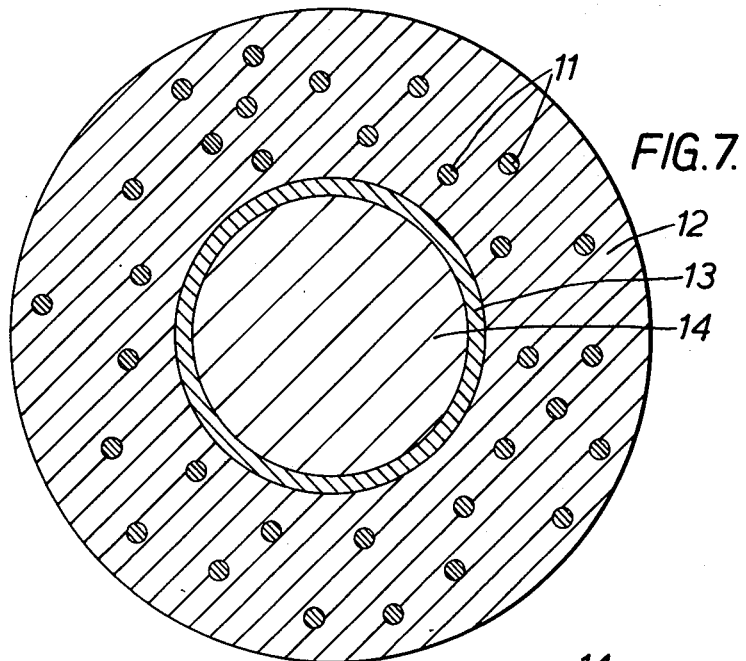
Figure 8:
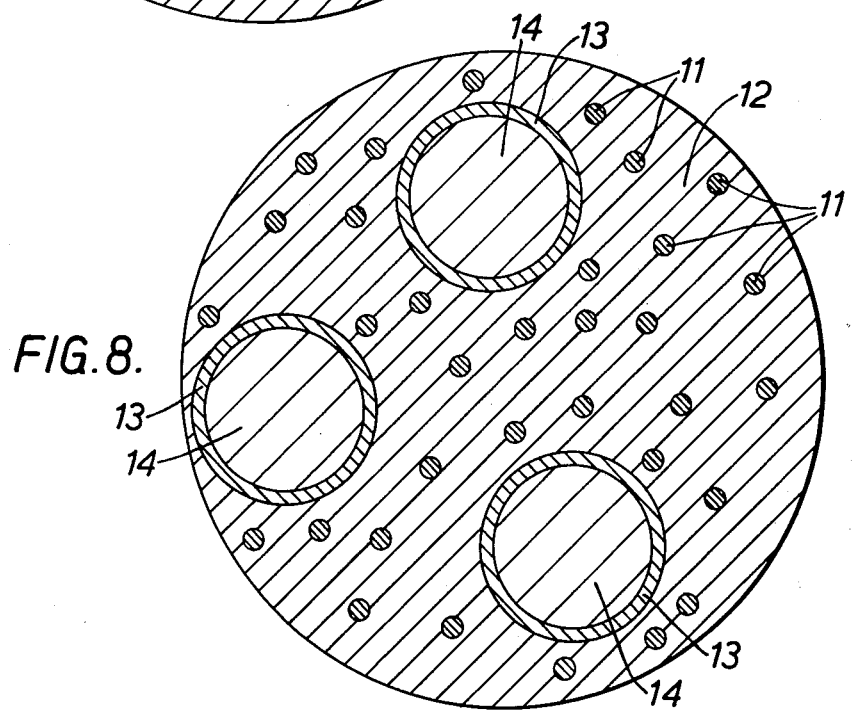

In another method several of these multicore filaments may be placed inside a tube of barrier metal, and this tube, possibly with other similar tubes, is then bundled with rods or wires of the pure metal before the composite is deformed to produce wire of the required filament thickness (FIG. 6). In these composites the bronze 12 has been inside the barrier tube and the pure metal 14 outside. The reverse arrangement is possible with the pure metal inside the barrier tube, and the bronze with rods or filaments of A on the outside. In these the pure metal may either form a core at the centre of the wire (FIG. 7) or be distributed elsewhere in the composite as in FIG. 8. These composites may be produced by essentially the same means as those described for the arrangements with bronze inside the barrier. They are probably easier to manufacture than when the pure metal is on the exterior since the latter is usually the softest component, which makes uniform deformation of the composite difficult at room temperature.

The following table specifies the elements and their relevant properties which have been taken into account in choosing a barrier for use in the manufacture of $Nb_3Sn$ using a copper-tin bronze with niobium filaments:

TABLE I

| Barrier Element | Maximum Solubility of Barrier Element in copper (a/o) | Maximum Solubility of tin in Barrier Element (a/o) |
|---|---|---|
| C | <0.0026 ? | No information, probably negligible |
| Ta | <0.009 ? | No information, probably negligible |
| Mo | negligible ? | $\geq 0.1$ |
| W | negligible | negligible |
| Os | negligible | negligible |
| Re | negligible | negligible |
| Ru | negligible | no information |
| Hb | 0.07 | negligible |
| Hf | 0.17 | ~16 |
| Zr | 0.275 | ~17 |
| Ce | 0.44 | no information |
| Ir | >0.48 | soluble, extent not determined |
| B | 0.53 | no information, probably low |
| Cr | 0.73 | $\approx 1$ (doubtful value) |
| V | 0.8 | $\approx 10$ |

Those elements which have a low solubility in copper ($\leq 0.1 a/o$) also in general dissolve negligible amounts of tin, whereas those with a slightly greater solubility (0.1 – 1.0 a/o) in copper can themselves dissolve appreciable amounts (up to 17 a/o) of tin. The choice of the barrier element is confined to those with less than 0.1 a/o solubility in copper. Of these only tantalum and niobium appear to have good mechanical properties and be reasonably plentiful. Trial composites have shown that tantalum barriers can be incorporated in composites to separate copper from bronze, containing niobium filaments, and protect the copper from diffusion thereinto of components of the bronze.

After reaction to form $Nb_3Sn$ no tin has been detected in the copper, or in the tantalum barrier. Layers of intermetallic phases have been found at the tantalum interfaces. Against the bronze the layer is found on analysis not to be $Ta_3Sn$ but a ternary compound 58.7 a/o tantalum, 34.3 a/o Cu and 7.0 a/o Sn. This layer is only about one-tenth as thick as the $Nb_3Sn$ layer around filaments. At the copper tantalum interface very little compound is formed but analysis of larger areas indicates it has an approximate composition of $Cu_2Ta$.

In further experiments, superconducting cables have been manufactured, by the above-described method, using tantalum layers drawn down during the fabrication to 7.5 microns thick, but nevertheless remaining continuous and functioning satisfactorily as a barrier.

Using a 6 atomic percent tin in copper bronze and 3 micron filaments of niobium, very satisfactory formation of $Nb_3Sn$ filaments has been achieved by solid state reaction at 650° C for 60 hours.

It is envisaged that still lower temperatures may be employed.

It is particularly desirable to be able to cable up wires formed by the above-detailed method, and possibly even wind into a coil structure, prior to carrying out the heat treatment to form the superconducting compound.

This can be achieved by insulating the wires, prior to heat treatment, with a refractory insulating layer such as alumina. It is, of course, important that a uniform deposition is achieved without heating the wire so much as to initiate formation of the superconducting compound. In practice this can be achieved by glow discharge deposition using the technique described in British Patent Specification No. 1,252,254.

Since the A component of the $A_3B$ superconducting compound is a refractory metal, it is also likely to be a good diffusion barrier between the bronze and the pure metal. As discussed above, barriers which form high field superconducting compounds with components of the bronze are undesirable in multifilamentary superconductors, since the filaments will be completely surrounded by a superconducting cylinder of much larger diameter so that the advantage of dividing the superconductor into many fine filaments will be largely lost until the critical field of this barrier is exceeded. The position with barriers of A metal is similar. In this case the critical field of the barrier compound is, of course, the same as that of the $A_3B$ filaments. More $A_3B$ will be produced in a given reaction time since the reaction can occur at the barrier interface as well as at the filaments.

If a composite containing separate barriers of A around each plug of bronze containing a single A filament is deformed sufficiently the tubes of $A_3B$ formed at the barriers on reaction can be made sufficiently small to provide the necessary stabilisation, but the amount of the $A_3B$ compound will be less than in an $A_3B$ filament of the same diameter. The A rods or filaments are not an essential feature of this superconductor, and if they were omitted a simpler multifilament superconductor would result. In this as many tubes of A, lined with a bronze core, as are required in the final superconductor are embedded in a block of pure metal which is deformed by hot or cold fabrication techniques to produce fine tubes of A of the necessary thinness. The whole assembly is then heated for a suitable time at a reaction temperature to produce annuli of $A_3B$ by reaction of the B element in the bronze with the tubes of A.

The starting material is shown schematically in FIGS. 9 and 10. The precise size, shape and arrangements of the various members can be varied to suit manufacturing requirements and such parameters as superconductor to pure metal ratios. The essential points are that in the final product after deformation fine tubes containing bronze are present in a pure metal matrix, reaction occurs by a solid state reaction, and after reaction no B, or other constituents of the bronze, have diffused into the pure metal. Solid state reactions are essential to the process, since they allow the $A_3B$ phase to be formed at a lower temperature than would in general be possible from the liquid, and the properties of $A_3B$ formed at these low temperatures are superior to those of $A_3B$ formed at high temperature.

Although the tube technique has been described for many tubes of metal A embedded in a matrix of pure metal,

TABLE II

| Feature in diagram | Temp. °C | Tin rich α Solid Solution | | | Solid phase richest in tin | | | Liquid richest in copper | | |
|---|---|---|---|---|---|---|---|---|---|---|
| | | a/oSn | Vol.ratio | rad.ratio | a/oSn | Vol.ratio | rad.ratio | a/oSn | Vol.ratio | rad.ratio |
| β peritectic | 798 | 7.7 | 0.344 | 1.704 | 13.2 | 0.487 | 1.433 | 15.5 | 0.535 | 1.367 |
| γ peritectic | 755 | | | | 16.5 | 0.554 | 1.343 | 19.1 | 0.597 | 1.294 |
| γ monotectic | 640 | | | | 28.0 | 0.709 | 1.188 | 43.1 | 0.826 | 1.100 |
| β eutectoid | 586 | 9.1 | 0.387 | 2.608 | | | | | | |

If we assume that no tin remains in the bronze at the end of the reaction (i.e. it is pure copper), that no porosity is produced, and the densities of $Nb_3Sn$ and Cu are 8.92 and 8.96 gm/cc, then the maximum ratio (volume ratio) of $Nb_3Sn$ to $Nb_3Sn$ plus Cu obtained from α-Cu solid solutions is 0.344 at 798° C and 0.387 at 586° C. When these are compared to filaments of $Nb_3Sn$ of the same $Nb_3Sn$ volume the ratios (radii ratios) of the tube to filament radii are 1.704 and 1.608 respectively. The amount of $Nb_3Sn$ formed in the tube has been slightly overestimated since a small amount (~1/3 a/o) of tin will remain in the copper at the end of the reaction.

Higher $Nb_3Sn$ contents of the reacted tubes could be obtained if tin rich phases were present in the bronze since $Nb_3Sn$ formation could then be maintained by tin diffusing from these phases into the α-Cu. Such bronzes are not employed since the hard or brittle nature of the intermetallic phases make fabrication difficult. This difficulty may be circumvented by incorporating a reservoir, or reservoirs, of tin in the bronze, e.g. as a core 15 (FIGS. 11 and 12). On annealing the tin can then dissolve directly into the α-Cu, or intermetallic phases could form which would then be denuded of tin on longer annealing. The essential point is to maintain a layer of α-Cu adjacent to the niobium tube, since at the reaction temperature $Nb_3Sn$ only forms by the solid route whereas $Nb_6Sn_5$ or $NbSn_2$ would form in preference to $Nb_3Sn$ if the liquid came in contact with the niobium. This form of tin enrichment is, of course, only feasible if all the deformation of the specimens can be done without intermediate heat treatment.

The extent of tin enrichment depends on the reaction temperature. If there is sufficient tin present to dissolve all the copper or bronze, then the solid state reaction is not possible, unless much tin reacted to form $Nb_3Sn$ during the heating up. Hence the composition of the liquid richest in copper gives the upper limit of tin enrichment at that temperature. These compositions are tabulated in Table II.

This method of enriching the bronze core with reservoirs of the B metal is applicable to any bronze system provided the B may be deformed with the surrounding bronze.

Although this 'tube' process has been described above without any rods or filaments of A inside the tubes, their presence is not precluded. Indeed the $A_3B$ reaction may be complete much sooner when they are present since more interfaces with the bronze will be present.

The tube technique may also be applied in cases where the refractory metal A is soluble in the pure stabilising metal, e.g. as Vanadium is in copper, if a metal barrier impermeable to both materials is placed between the refractory metal and the pure metal.

the method may be modified to allow individual tubes of A filled with bronze, or groups of such tubes, to be bundled together with rods or wires of the pure metal. The assembly thus formed is then fabricated to the final size by deformation processes and reacted to form $A_3B$. The techniques for bundling and deforming these tubes resemble those for assembling bronze filaments.

Another modification, for use in the whole or part of a superconductor, is to dispense with the pure metal matrix and form the holes for the bronze directly in a block of the refractory metal A.

A further modification is to provide the pure metal for stabilisation within tubes of the metal A. A bundle of such tubes is embedded in a block of the bronze which is then fabricated by deformation to the final size and heat treated to react A and B elements together to form $A_3B$.

We claim:

1. A method of manufacturing a superconducting member, which method comprises the steps of forming an alloy consisting essentially of a carrier material and at least one element from the group consisting of aluminium, gallium, indium, silicon, germanium, gold, platinum, antimony, rhodium, zirconium, palladium, osmium, ruthenium, cobalt, thallium, lead, arsenic, bismuth, iridium and tin; contacting the alloy with a base material consisting essentially of niobium or vanadium; consolidating into a unitary structure components comprising the alloy and the base material together with a metal, which is eventually to provide stabilisation, a barrier material consisting essentially of tantalum or molybdenum being present and positioned to protect the said metal from diffusion thereinto of any of the other components; mechanically working the said unitary structure to form a wire therefrom, and heat treating the said wire to cause a solid state reaction between the base material and the element or elements from the said group to form a superconducting compound therewith, the carrier material being so selected as to be substantially non-reactive with the base material under the heat treatment and the barrier material being so selected and positioned as to prevent permeation therethrough of the element from the said group and to be insoluble in and substantially non-reactive with the said metal, and the heat treatment temperature being controlled for avoiding melting of the alloy in contact with the base material at any stage during reaction.

2. A method as claimed in claim 1, wherein the alloy and the base material are in contact in the said wire along regions in which the superconducting compound is formed, the said regions being in the form of discrete filaments extending along the length of the wire.

3. A method as claimed in claim 1, wherein one of the components of the said unitary structure comprises a block having bores extending therethrough and at least one of the other components comprises rods or tubes received in the bores, the mechanical working of the unitary structure forming the block into a wire and the rods or tubes into a plurality of filaments embedded in the wire.

4. A method as claimed in claim 1, wherein all the components of the unitary structure are in the form of rods or tubes bundled together and the mechanical working forms the unitary structure into an extended wire having multifilamentary components.

5. A method of manufacturing a superconducting member, which method comprises forming a block of pure copper with bores extending therethrough, inserting into the said bores rods comprising an outer tubular sheath of niobium and an inner core of an alloy consisting essentially of a carrier material and at least one element from the group consisting of aluminium, gallium, indium, silicon, germanium, and tin, there being spaces within the said alloy core which spaces are filled with pure or essentially pure element or mixture of elements from the said group, said element or mixture of elements filling said spaces being the same as the element or mixture of elements present in the carrier as a dispersion or solid solution constituent of the alloy, the said filled spaces thus providing reservoirs of the essentially pure element or mixture of elements, said reservoirs being wholly separated from contact with base material by alloy interposed therebetween, mechanically working the block to form the block into a wire and the rod into filaments embedded in the wire, and heat treating the wire to cause a solid state reaction between the niobium and the element or elements from the said group within the alloy contacting the niobium, the pure or essentially pure element or elements from the said group in the said reservoirs diffusing, during the heat treatment, into the alloy thereby making up for depletion of the element or mixture of elements in the alloy as a consequence of the said solid state reaction and ensuring that there is an adequate supply of said elements or mixture of elements dispersed or in solid solution in the alloy in contact with the niobium to form an adequately thick layer of superconducting compound $Nb_3B$ where B is the said element or mixture of elements, the thickness and concentrations of the niobium and the B element or elements respectively being such that $Nb_3B$ superconductor formation does not extend wholly through the niobium sheath and the heat treatment temperature being controlled for avoiding melting of the alloy in contact with the niobium at any stage during the reaction.

* * * * *